United States Patent
Romanovskyy et al.

(10) Patent No.: US 7,590,017 B2
(45) Date of Patent: Sep. 15, 2009

(54) DRAM BITLINE PRECHARGE SCHEME

(75) Inventors: Sergiy Romanovskyy, Ottawa (CA); Sreedhar Natarajan, Stittsville (CA)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 173 days.

(21) Appl. No.: 11/734,588

(22) Filed: Apr. 12, 2007

(65) Prior Publication Data

US 2007/0242543 A1 Oct. 18, 2007

Related U.S. Application Data

(60) Provisional application No. 60/791,208, filed on Apr. 12, 2006.

(51) Int. Cl.
*G11C 7/00* (2006.01)

(52) U.S. Cl. .................. 365/203; 365/149; 365/210.1; 365/205

(58) Field of Classification Search ................ 365/203, 365/149, 210.01, 210.1, 205, 230.03
See application file for complete search history.

(56) References Cited

U.S. PATENT DOCUMENTS

| 5,508,960 | A  | * | 4/1996 | Pinkham | ...................... 365/207 |
| 6,862,233 | B2 | * | 3/2005 | Laurent  | ...................... 365/205 |

* cited by examiner

*Primary Examiner*—David Lam
(74) *Attorney, Agent, or Firm*—Slater & Matsil, L.L.P.

(57) ABSTRACT

Circuits and method for precharging a pair of complementary bitlines in a dynamic random access memory (DRAM). Both bitlines are precharged to VDD during a precharge phase, and during a sensing phase, the voltage of one of the pair of complementary bitlines is adjusted from VDD to a reference level. The reference level is generated by coupling the one of the pair of complementary bitlines to a capacitance means located within a reference voltage circuit. The reference voltage circuit can include one capacitor element or a plurality of capacitor elements connected in parallel with each other. Any number of the plurality of capacitor elements can be selectively enabled.

22 Claims, 11 Drawing Sheets

DRAM BITLINE PRECHARGE SCHEME

CROSS REFERENCE TO RELATED APPLICATIONS

This application claims the benefit of priority of U.S. Provisional Patent Application No. 60/791,208 filed on Apr. 12, 2006, which is incorporated herein by reference in its entirety.

FIELD OF THE INVENTION

The present invention relates generally to semiconductor memories. More particularly, the present invention relates to dynamic random access memory (DRAM) bitline precharging.

BACKGROUND OF THE INVENTION

Dynamic random access memory (DRAM) arrays include memory cells comprising of a storage capacitor and an access transistor. Any data to be read out from the memory cells requires sense amplifier circuits to provide a logic state corresponding to the charge stored in the storage capacitor of the memory cells. Performance of the DRAM can be affected by the speed at which this data is sensed.

Figure 1:
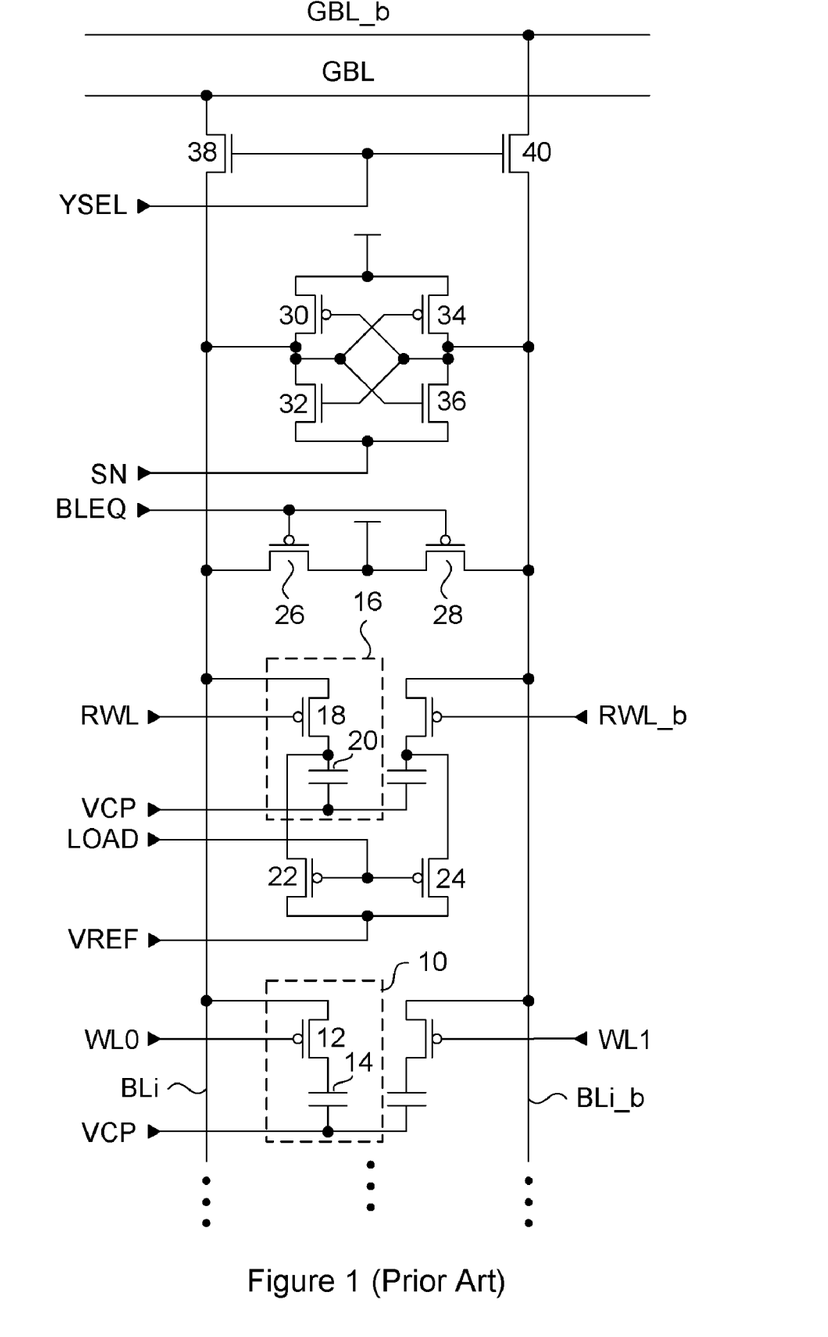
FIG. 1 is a circuit schematic of a DRAM memory array core circuits of the prior art.

While traditional DRAM bitline precharge schemes precharge bitlines to a mid-point voltage level, such schemes restrict sensing performance/speed when the internal high voltage supply (VDD) is too low, or the operating temperature is too low or negative. Hence a precharge to VDD or VSS scheme can be used instead. FIG. 1 illustrates a typical precharge to VDD scheme for DRAM. This precharge to VDD scheme uses reference cells that are similar to normal memory cells.

FIG. 1 is a circuit schematic showing a pair of complementary bitlines and memory cells of a typical DRAM memory array, and the core circuits involved for sensing the memory cell data. Connected to each of the complementary bitlines are memory cells, one of which is outlined in a dashed box referred to by reference number 10. Each DRAM memory cell includes an access transistor 12 in series with a storage capacitor 14. Access transistor 12 has its gate terminal connected to a wordline WL0 and the other terminal of storage capacitor 14 is connected to a cell plate voltage VCP. Those skilled in the art will understand that each memory cell connected to complementary bitlines BLi and BLi_b will be connected to a different wordline.

The sense circuitry for complementary bitlines BLi and BLi_b will now be described. Connected to each bitline are reference cells, one of which is outlined in a dashed box referred to by reference number 16. The function of the reference cells is to provide a reference voltage, slightly different from VDD, to either BLi or BLi_b. Those skilled in the art will understand that the reference voltage is applied to the unaccessed bitline, which depends on the particular wordline that is activated. Each reference memory cell is preferably identical in construction to a normal memory cell 10. Reference cell 16 includes an access transistor 18 in series with a storage capacitor 20. The gate terminal of access transistor 18 is connected to reference wordline RWL. Accordingly, the gate terminal of the other reference cell access transistor is connected to a different reference wordline RWL_b. Persons skilled in the art will understand that the wordlines and the reference wordlines can be logically decoded as being odd or even wordlines. Gating devices 22 and 24 couple a reference voltage VREF (ie. mid-point voltage level) to the storage capacitors of both reference cells in response to enable signal LOAD.

A bitline precharge circuit consisting of p-channel transistors 26 and 28 connected in series between BLi and BLi_b couple supply voltage VDD thereto in response to equalize signal BLEQ. When activated, BLEQ is driven to ground. A standard CMOS cross-coupled inverter sense amplifier consisting of transistors 30, 32, 34 and 36 senses a voltage differential between BLi and BLi_b. The n-channel devices receive a controlled low voltage level supply SN, where SN enables sensing functionality of the sense amplifier. The common node of transistors 30 and 32 are connected to VDD. Finally, a pair of column select devices 38 and 40 can couple BLi and BLi_b to respective global datalines GBLi and GBLi_b in response to column select signal YSEL.

The general sensing operation of the circuit of FIG. 1 is as follows. First, the bitlines are precharged to VDD by driving BLEQ to the low logic level during a precharge period. During this time signal LOAD is driven to the active level to couple VREF to the storage capacitors of both reference memory cells. VREF can be a mid-VDD voltage level for example. SN remains at VDD during the precharge period to disable the bitline sense amplifier.

During an active period, BLEQ is driven to the high logic level to turn off transistors 26 and 28, and enable signal LOAD is driven to the high logic level to turn off transistors 22 and 24. A wordline is driven to the active low logic level to couple its storage capacitor to a bitline. In this example, WL0 is activated. If storage capacitor 14 stores a logic "1" charge, then its stored charge will not change the voltage level of BLi. On the other hand, if storage capacitor 14 stores a logic "0", the voltage level of BLi is reduced through charge sharing. Through proper decoding, the reference charge of the memory cell connected to the complementary bitline BLi_b will be transferred to BLi_b by activating RWL_b when WL0 is activated. Because the reference storage capacitor 14 stores about half the charge of a logic "1" in a normal memory cell, the voltage level of BLi_b will drop. Then SN is driven to a low voltage level to enable the bitline sense amplifier and sense the voltage difference between BLi and BLi_b. When the full logic levels have been established by the bitline sense amplifier on BLi and BLi_b, YSEL can be activated to couple BLi and BLi_b to the global datalines GBL and GBL_b.

There are disadvantages associated in using reference cells for providing the reference voltage VREF for sensing. The reference cells and associated reference voltage circuits are additional devices within the memory array area, thereby increasing the size of the memory array. Since each reference cell provides a reference voltage to the complementary bitline, there can be variations in the reference voltage provided by different reference cells. This is mainly due to the fact that the reference cells are fabricated in a pitch of memory cells to be similar to the normal memory cells. Hence they will have a small size and be sensitive to process variations.

It is, therefore, desirable to provide a DRAM bitline precharge scheme that does not occupy additional memory array area, while providing the same reference voltage to all the unaccessed bitlines during a read operation.

SUMMARY OF THE INVENTION

It is an object of the present invention to obviate or mitigate at least one disadvantage of previous DRAM bitline precharge schemes. In particular, it is an object of the present invention to provide a DRAM bitline precharge scheme which provides a substantially constant reference voltage to all the unaccessed bitlines during a precharge and sensing operation.

In a first aspect, the present invention provides a sense circuit for a dynamic random access memory (DRAM). The sense circuit includes a precharge switch circuit, a bitline sense amplifier circuit, and a reference voltage circuit. The precharge switch circuit drives a pair of complementary bitlines to a first voltage supply during a precharge phase and adjusts one of the pair of complementary bitlines to a reference voltage by charge sharing during a sensing phase. The bitline sense amplifier circuit senses a voltage level of the other of the pair of complementary bitlines relative to the reference voltage on the one of the pair of complementary bitlines during the sensing phase. The reference voltage circuit has capacitance means selectively connected to the precharge switch circuit during the sensing phase.

In an embodiment of the present aspect, the reference voltage circuit includes a precharge circuit for precharging the capacitance means, and a selector switch for selectively coupling one of the first voltage supply and the capacitance means to an output node, the output node being connected to the precharge switch circuit. The selector switch can include a first transistor and a second transistor connected in series between the first voltage supply and a capacitance node, the output node being provided from a shared terminal of the first transistor and the second transistor. The precharge circuit can include a third transistor connected between the capacitance node and a second voltage supply. The capacitance means can include a capacitor having a first terminal connected to the capacitance node and a second terminal connected to the second voltage supply. In a further aspect of the present embodiment, the capacitance means can include a first capacitor and a second capacitor connected in parallel between the capacitance node and the second voltage supply. The first capacitor and the second capacitor can be selectively connected to the capacitance node through respective first and second switch circuits. An enabling transistor can be connected between the bitline sense amplifier circuit and a second voltage supply for enabling the bitline sense amplifier circuit in response to a sense enable signal.

In another embodiment of the present aspect, the precharge switch circuit includes a first steering transistor and a second steering transistor connected in series between the pair of complementary bitlines, and an input node at a shared terminal of the first steering transistor and the second steering transistor coupled to the capacitance means. An input transistor can be couple the capacitance means to the shared terminal of the first steering transistor and the second steering transistor when the bitline sense amplifier circuit is disabled. In a further aspect of the present embodiment, the precharge switch circuit can further include a first isolation transistor, a second isolation transistor and a precharge circuit. The first isolation transistor is connected between the first steering transistor and the one of the pair of complementary bitlines. The second isolation transistor is connected between the second steering transistor and the other of the pair of complementary bitlines. The precharge circuit provides the first voltage supply to the first isolation transistor and the second isolation transistor, and the first isolation transistor and the second isolation transistor are enabled when the bitline sense amplifier circuit is disabled. An enabling transistor can be connected between the bitline sense amplifier circuit and a second voltage supply for enabling the bitline sense amplifier circuit in response to a sense enable signal.

In a second aspect, the present invention provides a method for precharging a pair of complementary bitlines in a dynamic random access memory (DRAM). The method includes precharging the pair of complementary bitlines to a first voltage supply level during a precharge phase, and coupling one of the pair of complementary bitlines to a capacitance means during a sensing phase. According to embodiments of the present aspect, the step of precharging can include passing the first voltage supply level through first and second enabled steering transistors, the first and second steering transistors being serially connected between the pair of complementary bitlines. The step of precharging can further include precharging the capacitance means to a second voltage supply level during the precharge phase, and passing the first voltage supply level to the pair of complementary bitlines through first and second isolation transistors. The step of coupling can include selectively enabling one of a first steering transistor and a second steering transistor for coupling the capacitance means to one of the first and second isolation transistors.

In a third aspect, the present invention provides a dynamic random access memory. The dynamic random access memory includes a bank having bitline sense amplifier circuits connected to pairs of complementary bitlines, precharge switch circuits, a reference voltage circuit, a reference voltage circuit and a capacitance means. The precharge switch circuits are connected to the pairs of complementary bitlines for driving each of the pairs of complementary bitlines to a first voltage supply during a precharge phase, the precharge switch circuits adjusting one of the pairs of complementary bitlines to a reference voltage during a sensing phase. The reference voltage circuit is connected to each of the precharge switch circuits for providing the first supply voltage during the precharge phase and for providing a capacitance during the sensing phase. The capacitance means is connected to the reference voltage circuit for providing the capacitance.

According to an embodiment of the present aspect, the dynamic random access memory further includes a second bank identically configured to the bank, and a second reference voltage circuit. The second reference voltage circuit is connected to second bank precharge circuits for providing the first supply voltage during the precharge phase and for providing the capacitance during the sensing phase. The capacitance is provided by the capacitance means. In another embodiment, the reference voltage circuit can include a precharge circuit for precharging the capacitance means, and a selector switch for selectively coupling one of the first voltage supply and the capacitance means to an output node, the output node being connected to each of the precharge switch circuits. The selector switch can include a first transistor and a second transistor connected in series between the first voltage supply and the capacitance means. The output node is provided from a shared terminal of the first transistor and the second transistor. The precharge circuit can includes a third transistor connected between the capacitance means and a second voltage supply.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides circuits for precharging a pair of complementary bitlines in a dynamic random access memory (DRAM). Both bitlines are precharged to VDD during a precharge phase, and during a sensing phase, the voltage of one of the pair of complementary bitlines is adjusted from VDD to a reference level. The reference level is generated by coupling the one of the pair of complementary bitlines to a capacitance means located within a reference voltage circuit. The reference voltage circuit can include one capacitor element or a plurality of capacitor elements connected in parallel with each other, and any number of the plurality of capacitor elements can be selectively enabled. There is one reference voltage circuit per bank of the DRAM, and the reference voltage circuits of a plurality of banks can share the same set of capacitor elements.

Preferably, the bitlines are precharged to VDD in a precharge phase, but can be precharged to VSS in an alternate embodiment of the invention. In order to maximize the bitline split during sensing, the unaccessed bitline has its precharge voltage adjusted to a reference level of about VDD-100 mV. Alternately, the bitlines can be precharged to VSS and the unaccessed bitline can have its precharge voltage adjusted to a reference level of about 100 mV. An accessed bitline is one of a pair of complementary bitlines that is coupled to a storage capacitor of a memory cell when its corresponding access transistor is activated during a read operation. An unaccessed bitline is the other of the pair of complementary bitlines which acts as a reference bitline during a read operation.

Figure 2:
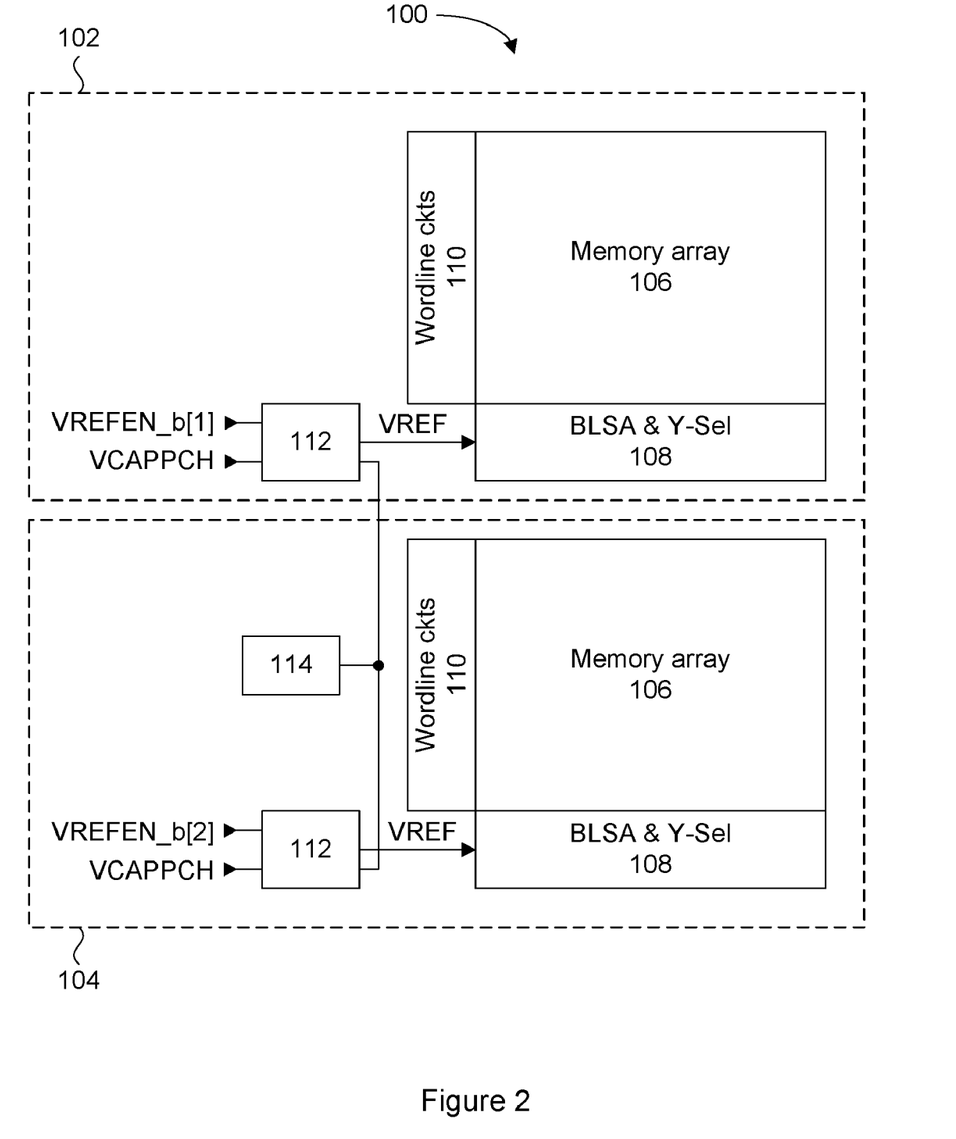
FIG. 2 is a block diagram of a DRAM device according to an embodiment of the present invention.

FIG. 2 is a block diagram of a DRAM device according to an embodiment of the present invention. DRAM device 100 can be configured as a plurality of banks, of which only two are illustrated in FIG. 1. Banks 102 and 104 are identically configured, and are shown to include a memory array 106 having wordlines and bitlines (not shown), a sense circuit block 108 connected to the bitlines for sensing bitline data, and a wordline circuit block 110 for driving wordlines in the memory array. Those skilled in the art will understand that FIG. 1 omits circuits and components that may be required to enable proper operation thereof. The sense circuit block 108 includes bitline sense amplifier circuits and precharge switch circuits for precharging pairs of complementary bitlines to a first supply voltage during a precharge phase, and then adjusting one of the pairs of complementary bitlines to a reference voltage level during a sensing phase. The bitline having its voltage adjusted can also be referred to as the unaccessed bitline of the pair of complementary bitlines, since the accessed bitline will have a memory cell connected to it during a read operation. The reference voltage level is obtained by coupling the bitline to capacitance means. Further details of the sense circuit block 108 will be described later.

Local to each bank 102 or 104 is a reference voltage circuit 112. The reference voltage circuit 112 has a node labeled VREF which is coupled to each precharge switch circuit in sense circuit block 108. According to one embodiment of the present invention, reference voltage circuit 112 can include its own capacitance means. According to one embodiment, reference voltage circuit 112 can provide the first voltage supply level through node VREF.

Since only one of banks 102 and 104 is activated for a read operation, only the reference voltage circuit 112 of the active bank will be enabled. Hence, reference voltage circuit 112 of bank 102 receives a decoded enable signal VREFEN_b[1] while reference voltage circuit 112 of bank 104 receives a decoded enable signal VREFEN_b[2]. Both reference voltage circuits 112 of banks 102 and 104 can receive a common precharge signal VCAPPCH for enabling precharge of the capacitance means prior to sensing. In the presently described configuration, the reference voltage circuits 112 of banks 102 and 104 can share common capacitance means. The shared capacitance circuit is illustrated in FIG. 2 as capacitor block 114. In alternate embodiments, the DRAM device 100 can have groups of banks, where each group can share a common capacitance circuit.

Figure 3:
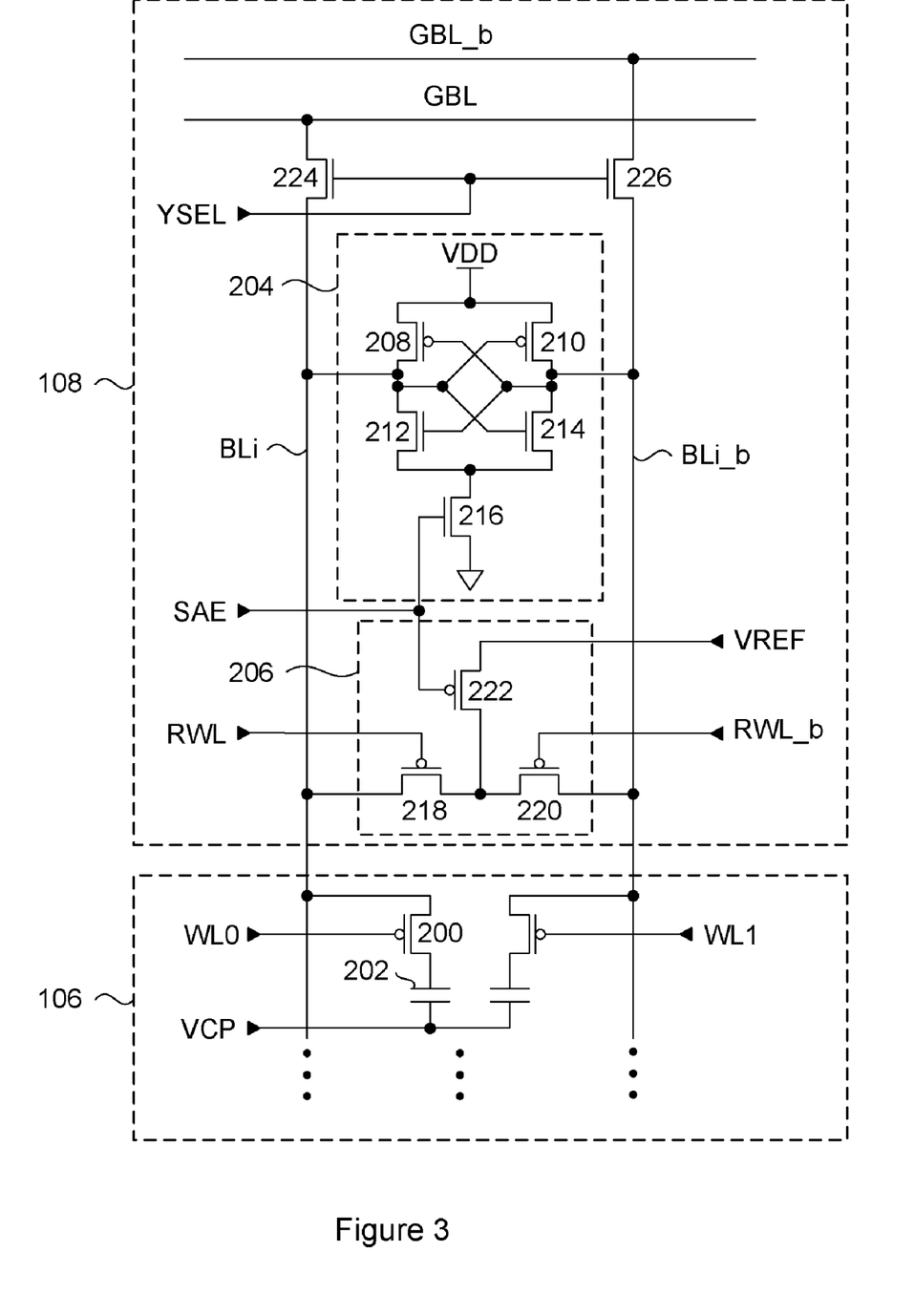
FIG. 3 is a circuit schematic of a portion of a DRAM memory array and the circuits of a sense circuit block of FIG. 2, according to an embodiment of the present invention.

FIG. 3 is a circuit schematic of a portion of a DRAM memory array and the circuits of sense circuit block 108, according to an embodiment of the present invention. The memory array 106 includes DRAM memory cells, similar to those previously shown in FIG. 1. For the present example, only two memory cells are shown. Each memory cell includes a p-channel access transistor 200 and a storage capacitor 202, connected in series between a bitline and a cell plate voltage VCP. Each access transistor connected to bitlines BLi and BLi_b receives a different wordline. In the present example, WL0 and WL1 are connected to the two memory cells shown in FIG. 1.

The sense circuit block 108 includes a CMOS bitline sense amplifier circuit 204 and a precharge switch circuit 206. The bitline sense amplifier circuit 204 consists of transistors 208, 210, 212 and 214, the configuration of which is well known in the art. This bitline sense amplifier is similar to the one shown in FIG. 1. There is an enabling transistor 216 connected between the drain terminals of n-channel transistors 212 and 214 and a second supply voltage VSS. In an alternate embodiment, there can be one enabling transistor 216 shared between any number of bitline sense amplifier circuits 206. The enabling transistor 216 has a gate terminal for receiving a sense enable signal SAE, and is turned on when SAE is at the high logic level (ie. VDD). When SAE is at the high logic level, n-channel transistors 212 and 214 will turn on and any voltage differential on BLi and BLi_b will be driven to the full supply voltage levels.

The precharge switch circuit 206 includes a first steering transistor 218 and a second steering transistor 220 connected in series between the pair of complementary bitlines BLi and BLi_b. Reference wordlines RWL and RWL_b are connected to the gate terminals of the first steering transistor 218 and the second steering transistor 220 respectively. An input node is located at a shared terminal of the first steering transistor and the second steering transistor. The input node can be coupled to the capacitance means of the reference voltage circuit through a p-channel input transistor 222. The input transistor 222 is turned on when sense enable signal SAE is at the low logic level (ie. VSS), for coupling the input node to the VREF node of the reference voltage circuit. Finally, a pair of n-channel column select devices 224 and 226 couple BLi and BLi_b to GBL and GBL_b respectively, in response to column select signal YSEL.

Figure 4:
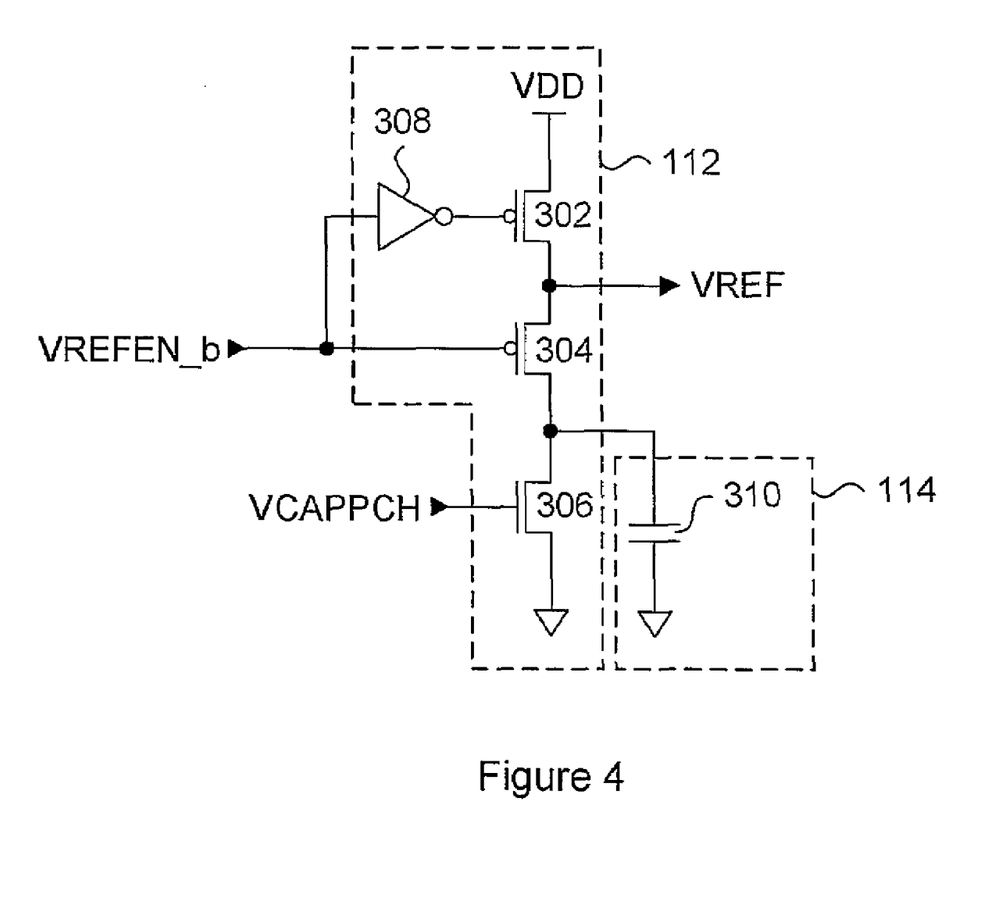
FIG. 4 is a circuit schematic of a reference voltage circuit and capacitor block according to an embodiment of the present invention.

FIG. 4 is a circuit schematic showing an embodiment of the reference voltage circuit 112 and capacitor block 114 shown in FIG. 2. The reference voltage circuit 112 embodiment of FIG. 4 can selectively provide the VDD precharge voltage or additional capacitance through the VREF node to all the precharge switch circuits 206 in the bank. Because there is one reference voltage circuit 112 for the bank, the resulting reference voltage on the unaccessed bitlines will be more consistent relative to schemes where the reference voltage is provided by reference cells. Reference cells are subject to process variation and defects which can affect the reference voltage being applied to the unaccessed bitline.

Reference voltage circuit 112 includes two p-channel transistors 302, 304 and an n-channel transistor 306 connected serially between VDD and VSS. The gate of p-channel transistor 304 receives an active low enabling signal VREFEN_b, while the gate of p-channel transistor 302 receives the complement of VREFEN_b via inverter 308. The gate of n-channel transistor 306 receives an active high capacitance precharge signal VCAPPCH. Connected between the drain of n-channel transistor 306 and VSS is a capacitance means 310, represented by a single capacitor in this particular embodiment. The VREF node is provided at the common shared terminals of p-channel transistors 302 and 304. While one capacitor element is shown, capacitor means 310 can consist of multiple capacitor elements connected in parallel with each other. Transistors 302 and 304 function as a selector switch for coupling either VDD or capacitance means 310 to the VREF node. Transistor 306 can be referred to as a precharge circuit for capacitance means 310.

Figure 5:
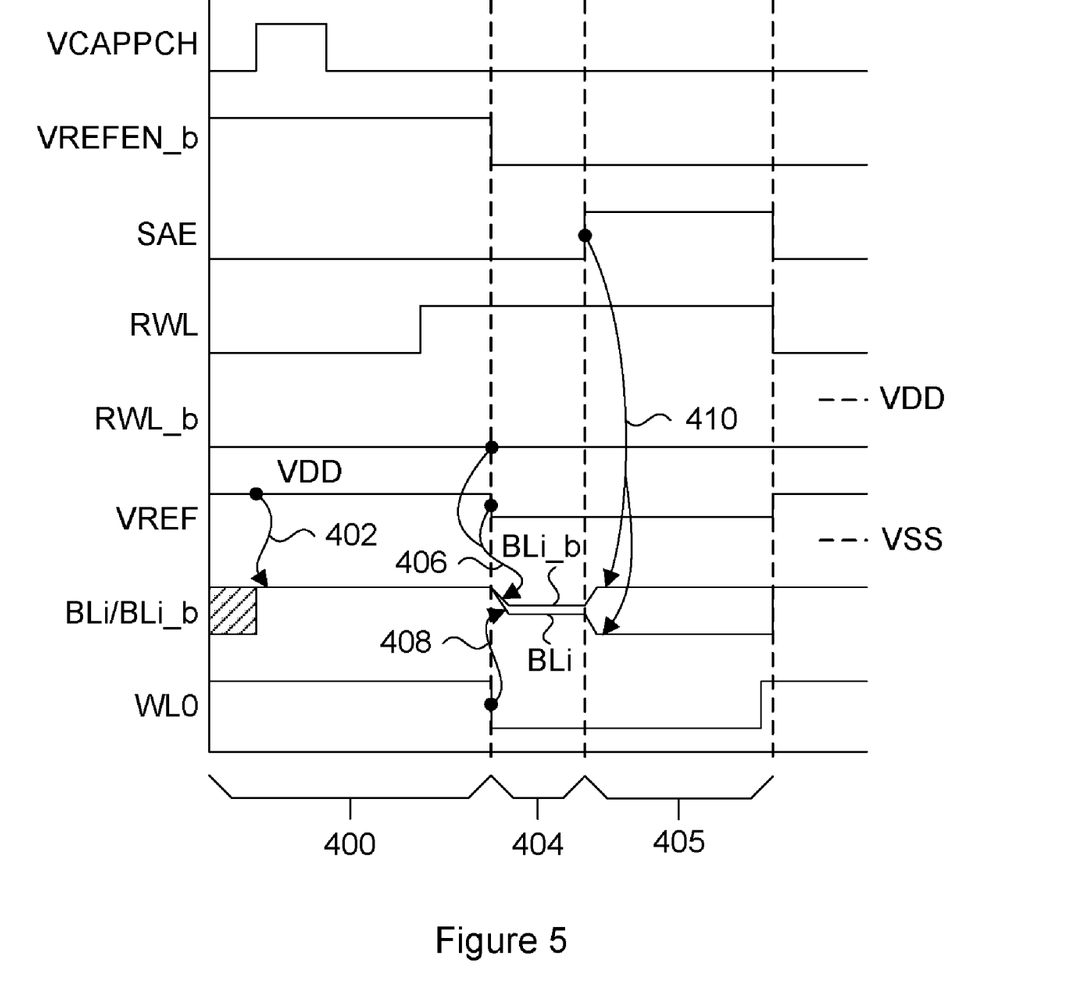
FIG. 5 is a sequence diagram illustrating the operation of the circuits of FIGS. 3 and 4, according to an embodiment of the present invention.

The general operation of the circuits shown in FIG. 3 and FIG. 4 will now be described with reference to the sequence diagram of FIG. 5. During the precharge phase 400, the precharge switch circuit 206 is responsible for precharging both BLi and BLi_b to the first supply voltage VDD. The precharge phase is defined as the period before a wordline (WL0) is activated. In FIG. 4, signal VCAPPCH can be pulsed to the high logic level to precharge capacitance means 310 to VSS at any time while signal VREFEN_b is at the high logic level to connect node VREF to VDD during precharge phase 400. Thus, both RWL and RWL_b are driven to the low logic level (ie. VSS) to turn on steering transistors 218 and 220, and SAE is at the low logic level to turn on input transistor 222. Hence the bitline sense amplifier circuit 204 is disabled. As shown by transition arrow 402 in FIG. 5, VREF at VDD drives both bitlines BLi and BLi_b to VDD.

During the sensing phase 404, the precharge switch circuit 206 is responsible for adjusting one of the pair of complementary bitlines to a reference voltage. The sensing phase is defined as the period between activation of a wordline (WL0) and activation of the bitline sense amplifier circuit 204. In the sensing phase, a row address is decoded to determine the wordline to be activated. For example, the row address can be decoded to indicate that WL0 is to be activated. With this decoded information, simple decoding can determine that RWL_b is to be activated. Therefore, prior to wordline activation, RWL is driven to the high logic level while RWL_b is kept at the low logic level. Hence, BLi floats at the precharged VDD level as it is disconnected from VREF. Subsequently, VREF is disconnected from its source of VDD by driving VREFEN_b to the low logic level in the reference voltage circuit 112, which couples the capacitive means 310 to the VREF node. Occurring at substantially the same time, the wordline WL0 is activated by driving it to the low logic level. VREFEN_b can be driven in response to one or more of the same signals used for controlling WL0. Through charge sharing between the capacitive means and BLi_b, the voltage level of BLi_b is adjusted to a slightly lower voltage level in response to the change in VREF, as shown by transition arrow 406. In an example embodiment, the resulting voltage on BLi_b can be about VDD-100 mV.

If for example the storage capacitor 202 stored a logic "0" level (an absence of charge), BLi will drop to below VDD-100 mV at transition arrow 408. On the other hand, if the storage capacitor 202 stored a logic "1" (a full charge), BLi will remain at approximately VDD (not shown). After a short duration of time to allow the bitline voltages to settle, SAE is driven to the high logic level, thereby activating the bitline sense amplifier circuit 204.

In the bitline development phase 405 the bitlines are driven to their respective voltage levels by bitline sense amplifier circuit 204. The bitline development phase is defined as the period between sense amplifier activation and closing or deactivation of the selected wordline (WL0). Therefore, the voltage differential between BLi and BLi_b is amplified such that BLi is driven to the full VSS level while BLi_b is driven to the full VDD level, as shown at transition arrow 410. If the storage capacitor 202 stored a logic "1", the bitline sense amplifier will drive BLi to the full VDD level and BLi_b to the full VSS level. An advantage of having the gate of p-channel input transistor 222 connected to SAE is that BLi is automatically disconnected from VREF just prior to sensing by the bitline sense amplifier circuit 204. This ensures that the bitline sense amplifier circuit 204 is not loaded by the capacitance means of VREF. WL0 will remain active to restore charge to storage capacitor 202. WL0 will be disabled prior to the fall of SAE to the low logic level and prior to the activation of YSEL (not shown). YSEL is activated to couple the BLi and BLi_b voltages to GBL and GBL_b.

In preparation for the next sensing phase, a new precharge phase is entered by driving SAE to the low logic level, RWL to the low logic level, and switching the VREF node to provide VDD. For the reference voltage circuit 112 of FIG. 4, VREFEN_b is driven to the high logic level and VCAPPCH can be pulsed to the high logic level to discharge any charge stored in capacitance means 310. Those skilled in the art will understand that FIG. 5 does not show specific timing or temporal relationships between signals, and is only intended to illustrate a relative sequence of signal transitions to illustrate the embodiments of the invention. Those skilled in the art will understand that specific timing can be implemented based on design parameters for specific processes and circuit configurations.

Figure 6:
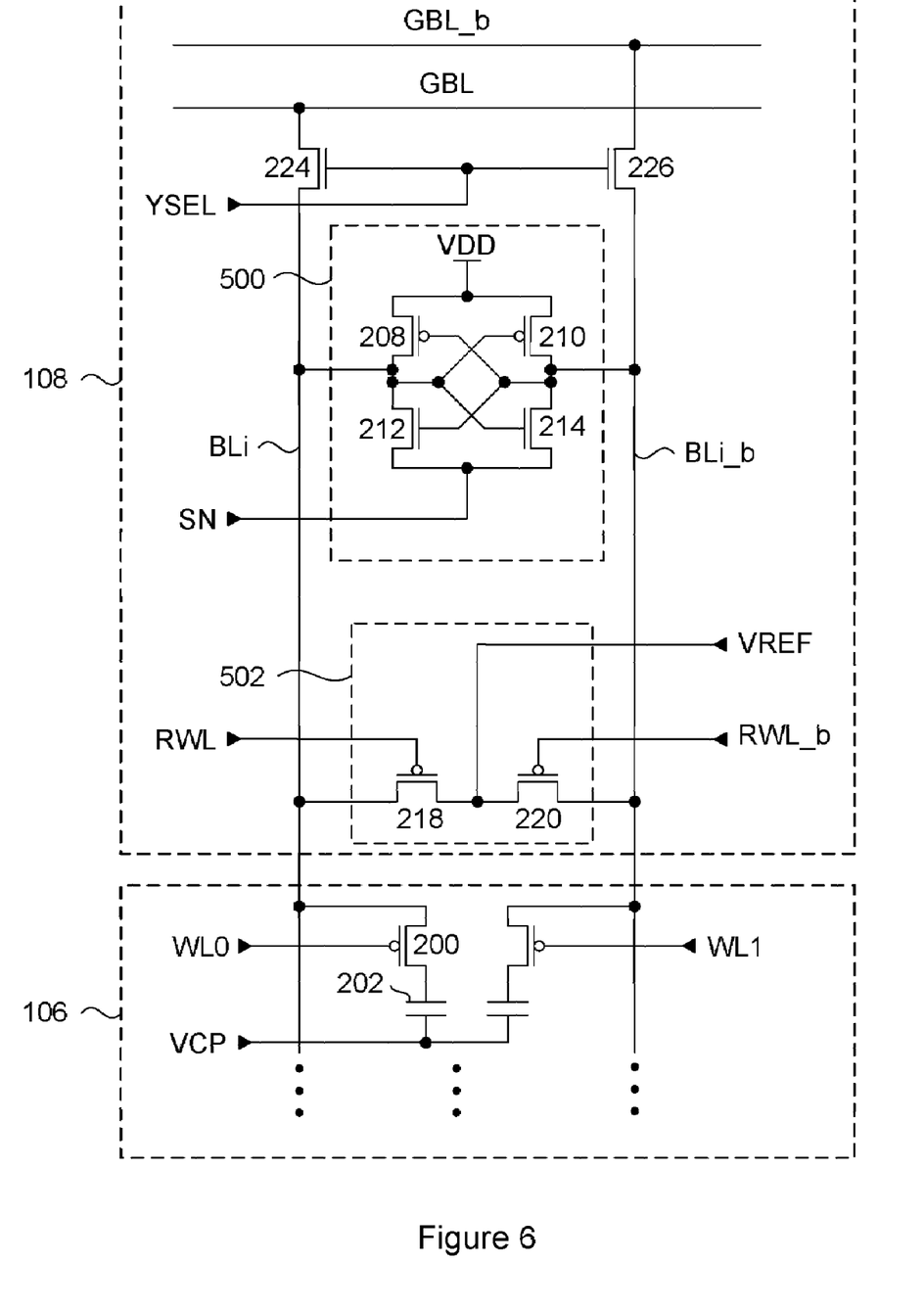
FIG. 6 is a circuit schematic showing an alternate embodiment of the sense circuit block shown in FIG. 3.

FIG. 6 is a circuit schematic showing an alternate embodiment of the sense circuit block 108 shown in FIG. 3. In this particular embodiment, enabling transistor 216 and p-channel input transistor 222 are omitted. Bitline sense amplifier circuit 500 now only includes transistors 208, 210, 212 and 214. The common source terminals of transistors 212 and 214 are connected to controlled low voltage level supply SN (VSS for example), as in the prior art bitline sense amplifier circuit of FIG. 1. The precharge switch circuit 502 now has the VREF node connected directly to the common terminals of steering transistors 218 and 220. The precharge operation of precharge switch circuit 502 is the same as previously described for the embodiment of FIG. 3. Due to the absence of enabling transistor 216 and p-channel input transistor 222, the sensing operation is different than that of the embodiment of FIG. 3.

During the sensing phase of operation, both RWL and RWL_b will need to be driven to VDD before bitline amplification begins, which is initiated when node SN is driven to VSS. The reason for this is to disconnect both BLi and BLi_b from the VREF node during sensing by bitline sense amplifier circuit 500.

Figure 7:
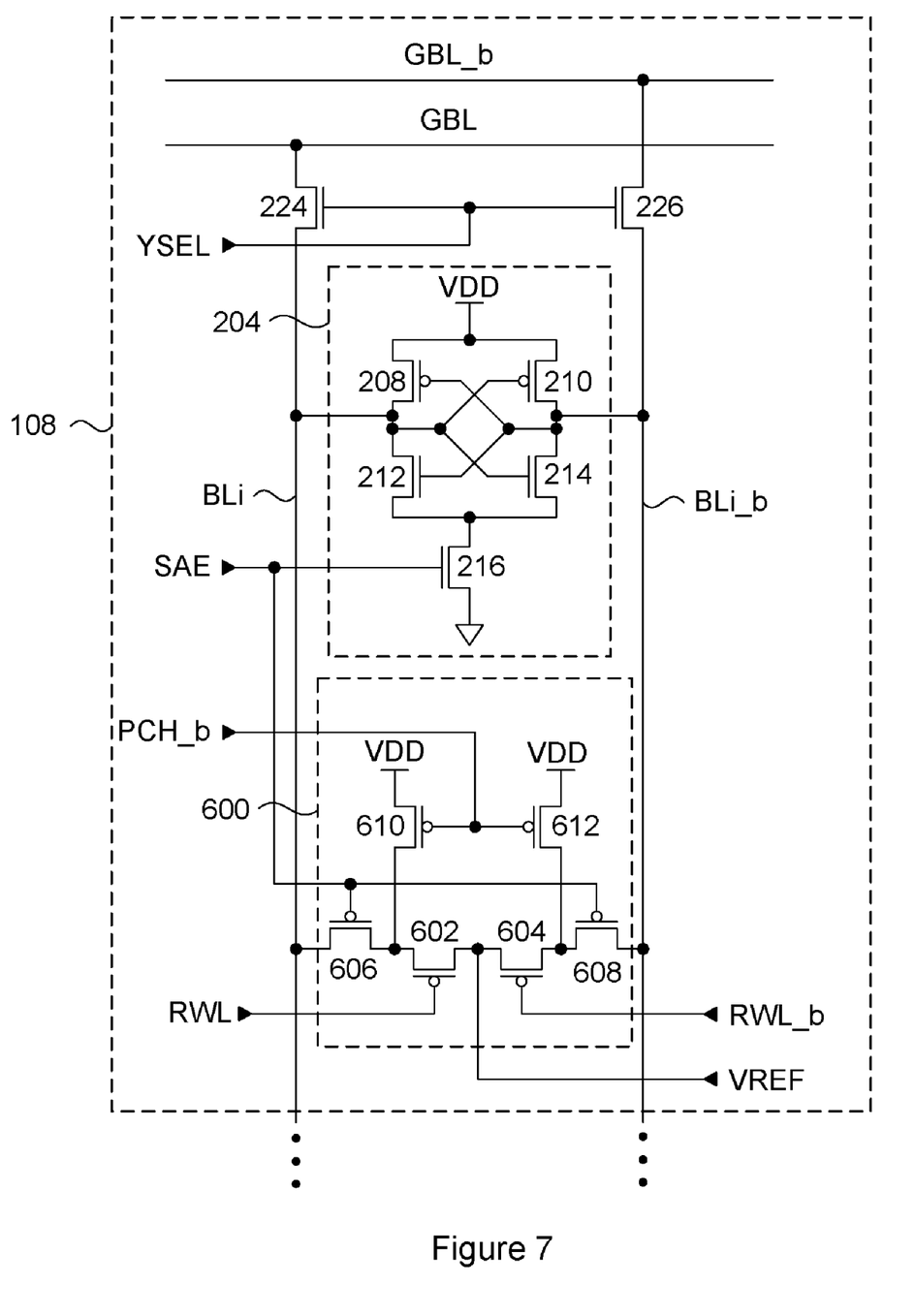
FIG. 7 is a circuit schematic showing yet another alternate embodiment of the sense circuit block shown in FIG. 3.

FIG. 7 is a circuit schematic showing a further alternate embodiment of the sense circuit block 108 shown in FIG. 3. In order to simplify the schematic, the memory array is omitted from FIG. 7. In the present embodiment, bitline sense amplifier circuit 204 is the same as the one shown in FIG. 3. The bitline switch circuit 206 of FIG. 3 has been replaced with a bitline precharge circuit 600, which is configured to provide the VDD precharge voltage directly to the bitlines instead of from the VREF node as shown in the previous embodiments. The bitline precharge circuit 600 includes steering transistors 602, 604 and isolation transistors 606, 608 connected in series between BLi and BLi_b, and precharge transistors 610 and 612. In the present embodiment, all the transistors of bitline precharge circuit 600 are p-channel transistors. The gate terminals of steering transistors 602 and 604 receive signals RWL and RWL_b respectively, while the gate terminals of isolation transistors 606 and 608 receive the sense enable signal SAE. Precharge transistors 610 and 612 couple supply voltage VDD to the shared terminals of transistors 602/606 and 604/608 respectively, in response to the active low precharge signal PCH_b. An advantage of having the gates of isolation transistors 606 and 608 connected to SAE is that both BLi and BLi_b are automatically disconnected from VREF just prior to bitline amplification by the bitline sense amplifier circuit 204. This ensures that the bitline sense amplifier circuit 204 is not loaded by the capacitance means of VREF.

In the present embodiment, precharge transistors 610 and 612 provide the VDD precharge voltage to the bitlines, and the VREF node can be connected to a capacitance means to provide the proper reference voltage on the unaccessed bitline. Alternately, the VREF node can be connected to a voltage generator that provides the desired constant reference voltage for application to the unaccessed bitline. Voltage generator circuits are well known in the art. The operation of the sense circuit block 108 of FIG. 7 will be described with reference to the sequence diagram of FIG. 8.

Figure 8:
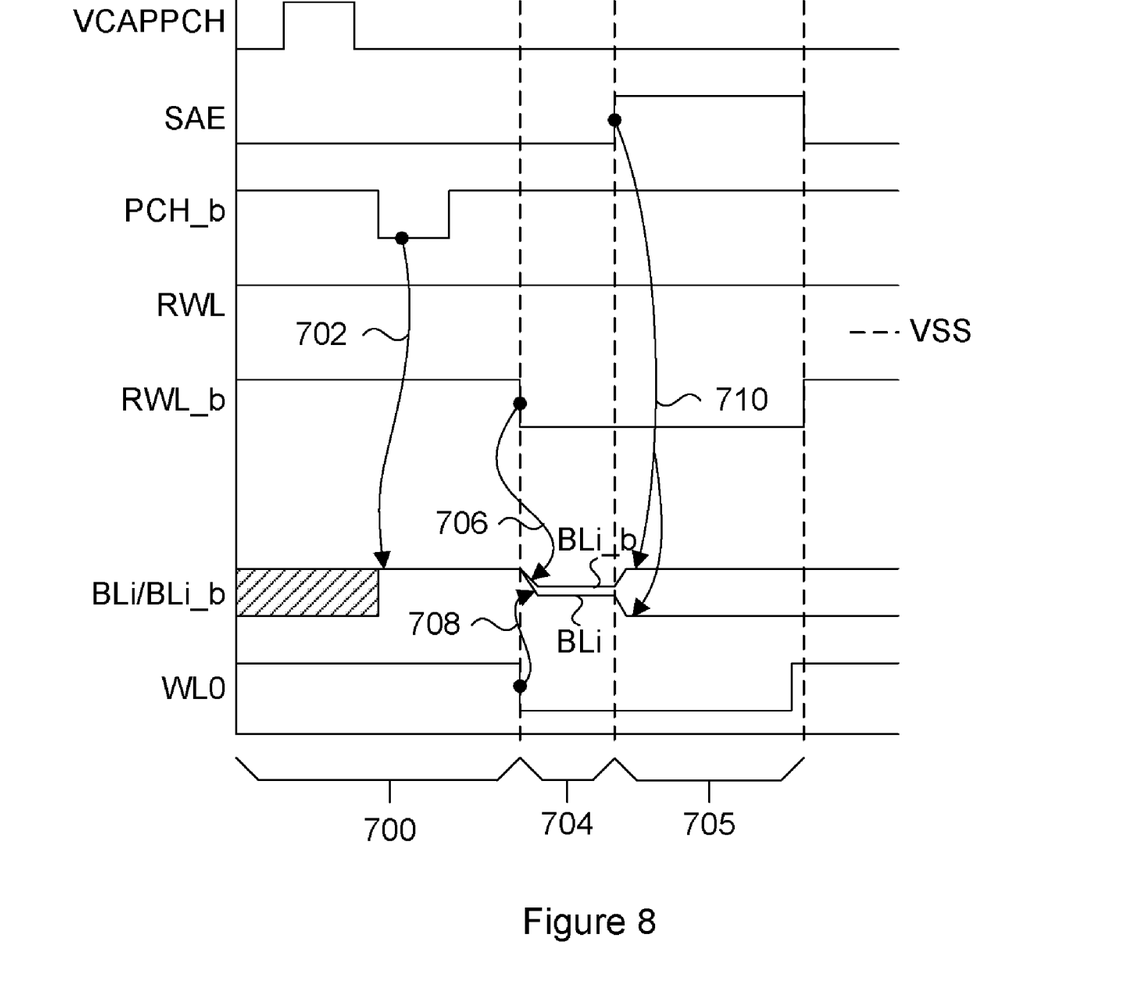
FIG. 8 is a sequence diagram illustrating the operation of the circuit of FIG. 7, according to an embodiment of the present invention.

In the present example, it is assumed that the VREF node is connected to a capacitance means circuit. The capacitance means circuit can be a modified version of the reference voltage circuit 112 shown in FIG. 4, where transistors 302 and 304 and inverter 308 are omitted, thereby leaving n-channel transistor 306 connected in parallel with capacitor means 310. In such a configuration, node VREF is connected to the drain terminal of transistor 306. During the precharge phase 700, both RWL and RWL_b are set to the high logic level (ie. VDD) to turn off steering transistors 602 and 604, and SAE is at the low logic level to turn on isolation transistors 606 and 608. Hence the bitline sense amplifier circuit 204 is disabled. In the capacitance means circuit described above, signal VCAPPCH can be pulsed to the high logic level to precharge capacitance means 310 to VSS. VCAPPCH can be pulsed at any time while both steering transistors 602 and 604 are turned off.

At any time during the precharge phase 700, signal PCH_b pulses to VSS for a short duration of time to turn on precharge transistors 610 and 612. Since isolation transistors 606 and 608 are turned on, BLi and BLi_b are precharged to the first supply voltage VDD at transition arrow 702.

In the sensing phase 704, a row address is decoded to determine the wordline to be activated. For example, the row address can be decoded to indicate that WL0 is to be activated. With this decoded information, simple decoding can determine that RWL_b is to be activated. Through charge sharing between the capacitive means and BLi_b, the voltage level of BLi_b is adjusted to a slightly lower voltage level in response to the change in VREF, as shown by transition arrow 706. In an example embodiment, the resulting voltage on BLi_b can be about VDD-100 mV. If it is assumed that a storage capacitor of the memory cell connected to WL0 stored a logic "0" level (an absence of charge), BLi will drop to below VDD-100 mV at transition arrow 708. After a short duration of time to allow the bitline voltages to settle, SAE is driven to the high logic level, thereby activating the bitline sense amplifier circuit 204 and isolating the bitlines from precharge transistors 610 and 612, and from the reference voltage circuit 112.

In the bitline development phase 705, the voltage differential between BLi and BLi_b is amplified such that BLi is driven to the full VSS level while BLi_b is driven to the full VDD level, as shown at transition arrow 710. It is noted that once activated, both RWL and RWL_b can remain at their respective levels through the sensing phase and the bitline development phase 705. Eventually, WL0 will be disabled prior to the fall of SAE to the low logic level.

According to an alternate embodiment of the present invention, the sense circuit block 108 of FIG. 7 can be used in combination with the reference voltage circuit 112 shown in FIG. 4. In this embodiment, the precharge transistors 610 and 612 of FIG. 7 and transistor 302 of FIG. 4 can be turned on at the same time to increase the speed at which BLi and BLi_b precharge to VDD. In the present embodiment, a slight modification is made to the reference voltage circuit 112 shown in FIG. 4, resulting in the alternate reference voltage circuit 800 shown in FIG. 9.

The reference voltage circuit 800 is identical to reference voltage circuit 112 of FIG. 4, except that the gate of transistor 302 receives precharge signal PCH_b. Hence, transistor 302 is now controlled by the same signal used to control precharge transistors 610 and 612 of FIG. 7. Now signal VREFEN_b controls only transistor 304. The operation of the sense circuit block 108 of FIG. 7 with the reference voltage circuit 800 shown in FIG. 9 will be described with reference to the sequence diagram of FIG. 10.

In the precharge phase 802, both RWL and RWL_b are set to the low logic state, thereby turning on respective primary steering transistors 602 and 604. Then the precharge signal PCH_b pulses low to turn on precharge transistors 610 and 612. As transistor 302 of FIG. 9 receives PCH_b as well, it will be turned on at the same time to provide additional current to the VREF node. During the precharge phase, VREFEN_b remains at the inactive high logic level to keep transistor 304 of FIG. 9 turned off so that VCAPPCH can be pulsed to the high logic level without affecting VREF. VCAPPCH is preferably pulsed at any time while VREFEN_b is at the high logic level to precharge capacitance means 310, although it may be preferable to do so just before VREFEN_b falls to the low logic level. At any time after the PCH_b pulse and before the activation of a wordline and a reference wordline, VREFEN_b is driven to the low logic state to turn on transistor 304, and couple VREF to capacitance means 310.

As in the previously described embodiments, the sensing phase 804 begins when a wordline (WL0) is to be activated. If it assumed that WL0 is activated, then the corresponding reference wordline to be activated will be RWL_b. Since both RWL and RWL_b are already in the active state, RWL is simply deactivated by driving it to the high logic level. Now the voltage of bitline BLi_b will change in response to the VREFEN_b falling to the low logic level. VREFEN_b preferably falls as RWL rises, or just shortly after RWL rises to prevent the VREF node from being coupled to both BLi_b and BLi at the same time. At the end of the bitline development phase 805, RWL is driven to the low logic level while RWL_b remains at the low logic level. Preferably, RWL drops to the low logic level at the same time SAE drops to the low logic level.

Those skilled in the art will understand that FIGS. 8 and 10 do not show specific timing or temporal relationships between signals, and is only intended to illustrate a relative sequence of signal transitions to illustrate the embodiments of the invention. Those skilled in the art will understand that specific timing can be implemented based on design parameters for specific processes and circuit configurations.

Figure 9:
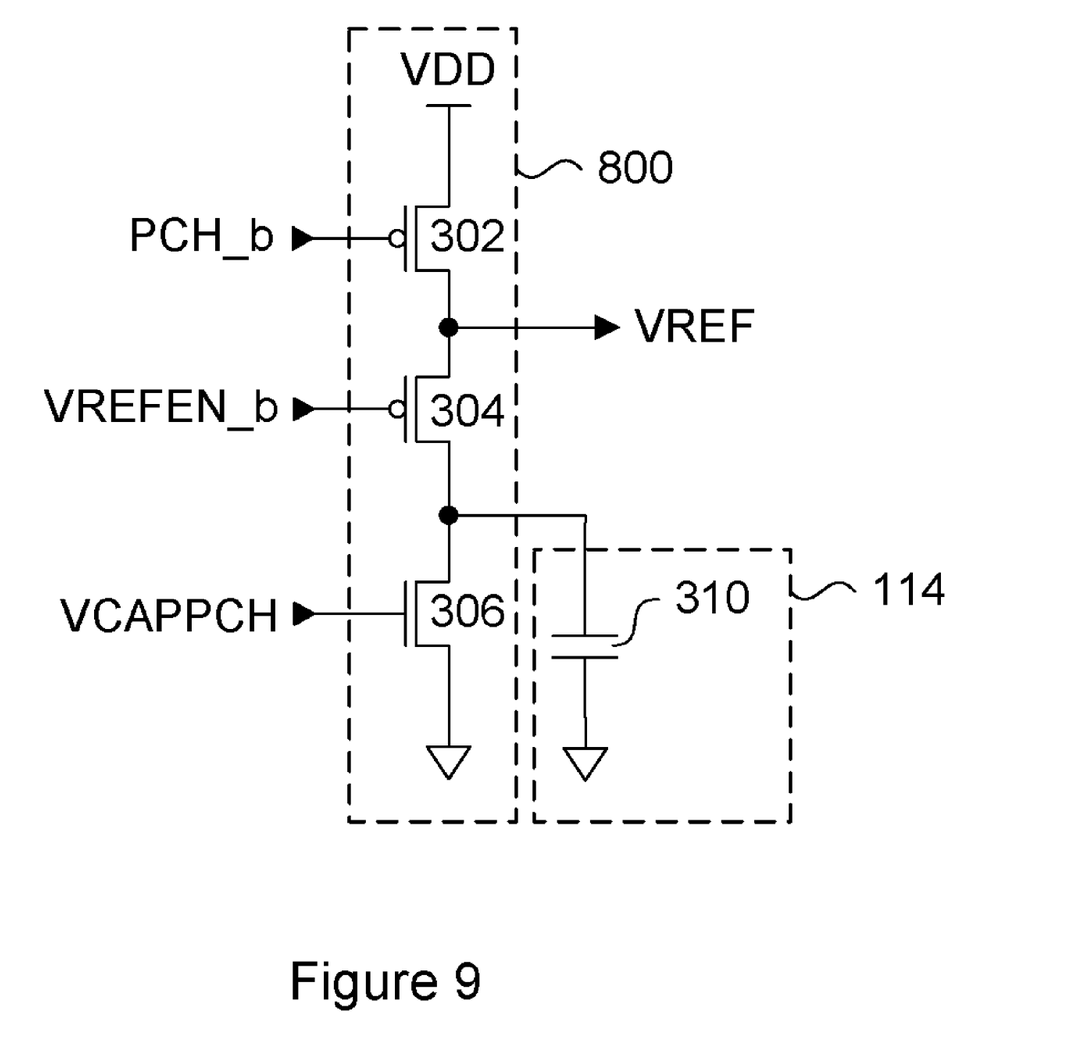
FIG. 9 is a circuit schematic of an alternate reference voltage circuit and capacitor block, according to an alternate embodiment of the present invention.
Figure 10:
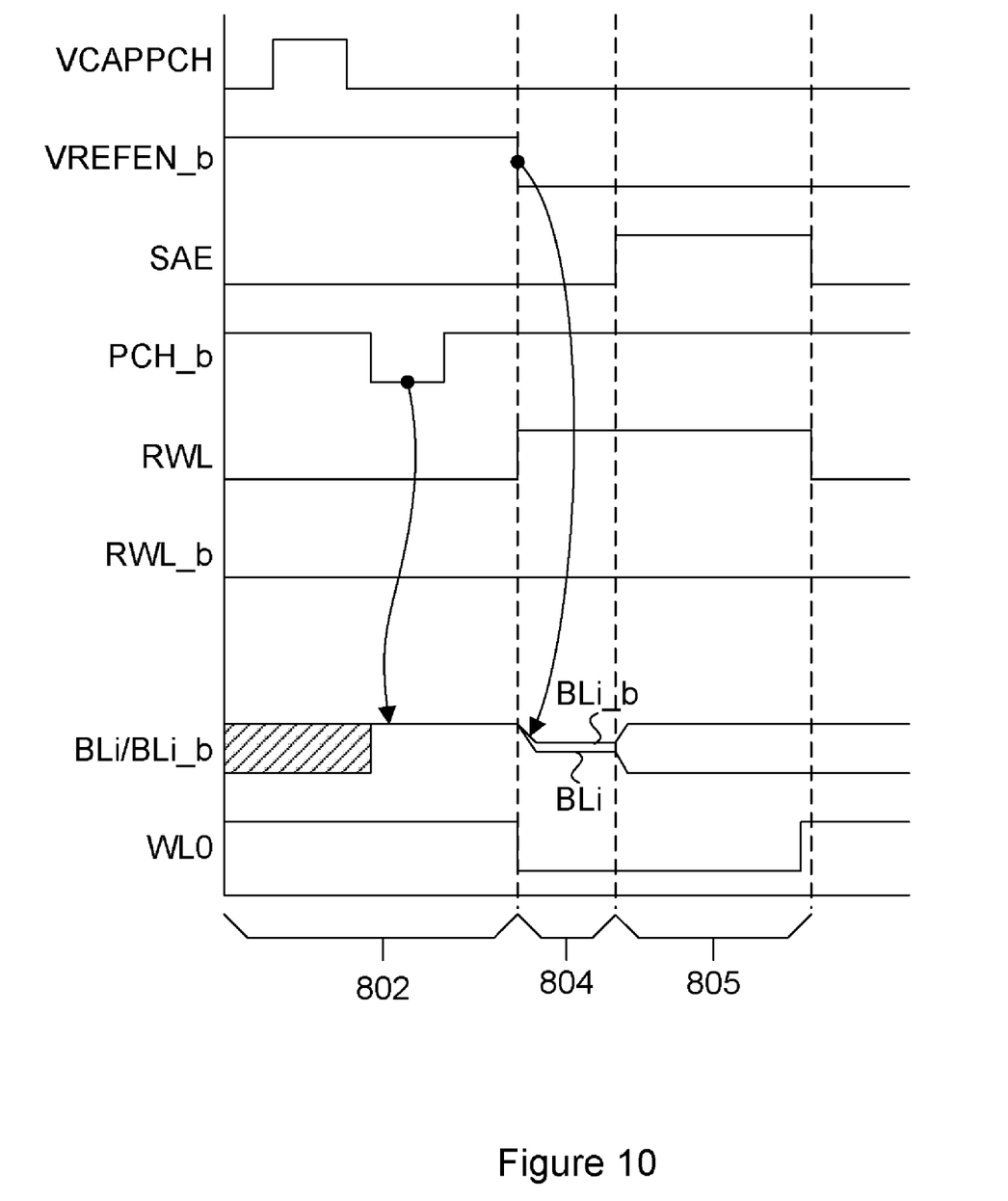
FIG. 10 is a sequence diagram illustrating the operation of the circuit of FIG. 7, according to an alternate embodiment of the present invention; and, FIG. 11 is a circuit schematic of an alternate reference voltage circuit and capacitor block according to an embodiment of the present invention.

The capacitance means 114 shown in FIG. 4 and FIG. 9 can advantageously be used to adjust the precharge voltage of an unaccessed bitline to a desired reference voltage through charge sharing. However, the resulting reference voltage cannot be adjusted to compensate for voltage supply variation, process variation and temperature variation since capacitor means 114 is fixed. Therefore, according to another embodiment of the present invention, the capacitance means 114 can include at least two capacitor elements, each being selectively connectable to the VREF node.

Figure 11:
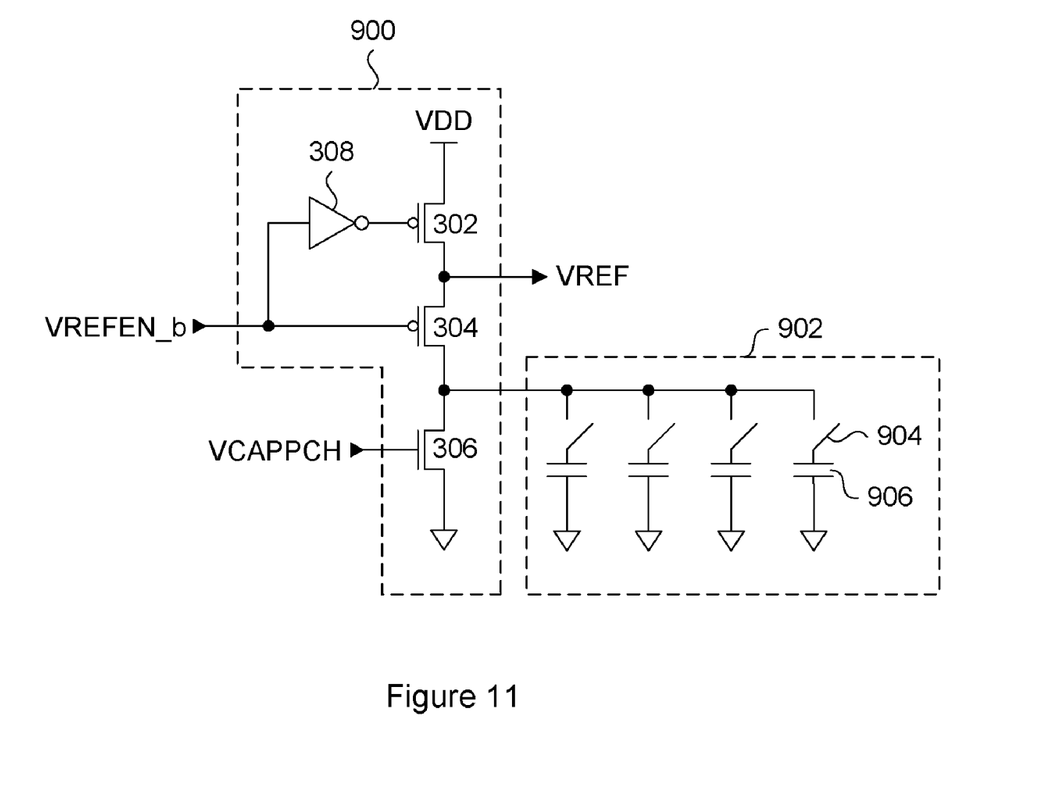

The reference voltage circuit 900 and capacitance block 902 shown in FIG. 11 is an embodiment where the reference voltage on the unaccessed bitline can be adjusted by selectively connecting any number of capacitor elements in the capacitance means, now called a capacitor reservoir. Reference voltage circuit 900 includes numbered elements 302, 304, 306 and 308 arranged in the same configuration as the same numbered elements in reference voltage circuit 112 of FIG. 4. Instead of having fixed capacitance means 114, the present circuit embodiment has an adjustable capacitance reservoir 902. The capacitance reservoir 902 includes at least two selectable capacitor circuits, where each capacitor circuit includes a switch circuit 904 and a capacitor element 906. The switch circuit 904 can be a transistor element, a fuse element, an anti-fuse element, or any type of circuit element which can allow for selective connection or disconnection of its respective capacitor element 906 from the drain terminal of transistor 306.

Those skilled in the art will understand that each capacitor element 906 can be identical in size, and hence capacitance, thereby providing substantially linear adjustment of VREF on the unaccessed bitline. Alternatively, each capacitor element 906 can have a different size from the other. The switch circuit 904 can be dynamically set by programming registers, or permanently set by setting fuses or anti-fuses.

Advantages of the disclosed reference voltage circuit 112, 800 and 900 are as follows. No VDD/2 voltage generator, typically implemented as an analog circuit, is not required because all bitlines are precharged to VDD. Reference voltage circuits 112, 800 and 900 do not require DC current, since capacitance charge sharing is used to adjust the voltage of the unaccessed bitlines. RWL and RWL_b are driven to either VDD or VSS, thereby simplifying the drive circuitry as no other intermediate or boosted voltages are required. To conserve area, one capacitance means 114 or capacitance reservoir 902 is shared amongst a specific number of reference voltage circuits (consisting of elements 302, 304, 306 and 308).

More specifically, in the DRAM device embodiment of FIG. 2, each reference voltage circuit 112 can be implemented with the circuit elements shown in FIGS. 4, 9 and 11, while capacitor block 114 can be implemented with capacitance means 310 shown in FIGS. 4 and 9 or capacitance reservoir 900 shown in FIG. 11. This configuration is ideal for architectures in which only one of the specific number of banks is accessed during a read operation.

The embodiments of the present invention have been described with respect to precharging bitlines to VDD. Those skilled in the art will understand that the previously presented sense circuit block 108 can be inverted and modified for precharging bitlines to VSS instead. For example, the circuit of FIG. 3 can be inverted such that transistors 212, 214, 216, 224 and 226 are p-channel devices, while transistors 208, 210, 218, 220 and 220 are n-channel devices and VSS and VDD are swapped with each other. Furthermore, those skilled in the art will understand that the specific capacitance values to be used can be determined based on the design parameters of the memory array circuits, bitline lengths, voltage supplies, etc.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A sense circuit for a dynamic random access memory (DRAM) comprising:

a precharge switch circuit that drives a pair of complementary bitlines to a first voltage supply during a precharge phase and that adjusts one of the pair of complementary bitlines to a reference voltage by charge sharing during a sensing phase;

a bitline sense amplifier circuit that senses a voltage level of the other of the pair of complementary bitlines relative to the reference voltage on the one of the pair of complementary bitlines during the sensing phase; and a reference voltage circuit having a capacitor selectively connected to the precharge switch circuit during the sensing phase.

2. The sense circuit of claim 1, wherein the reference voltage circuit includes
a precharge circuit that precharges the capacitor,
a selector switch selectively coupling one of the first voltage supply and the capacitor to an output node, the output node being connected to the precharge switch circuit.

3. The sense circuit of claim 2, wherein the selector switch includes a first transistor and a second transistor connected in series between the first voltage supply and a capacitance node, the output node being provided from a shared terminal of the first transistor and the second transistor.

4. The sense circuit of claim 3, wherein the precharge circuit includes a third transistor connected between the capacitance node and a second voltage supply.

5. The sense circuit of claim 4, wherein the capacitor has a first terminal connected to the capacitance node and a second terminal connected to the second voltage supply.

6. The sense circuit of claim 4, wherein the capacitor includes a first capacitor and a second capacitor connected in parallel between the capacitance node and the second voltage supply.

7. The sense circuit of claim 6, wherein the first capacitor and the second capacitor are selectively connected to the capacitance node through respective first and second switch circuits.

8. The sense circuit of claim 1, wherein the precharge switch circuit includes
a first steering transistor and a second steering transistor connected in series between the pair of complementary bitlines, and
an input node at a shared terminal of the first steering transistor and the second steering transistor coupled to the capacitor.

9. The sense circuit of claim 8, wherein the precharge switch circuit includes
an input transistor coupling the capacitor to the shared terminal of the first steering transistor and the second steering transistor when the bitline sense amplifier circuit is disabled.

10. The sense circuit of claim 8, wherein the precharge switch circuit further includes
a first isolation transistor connected between the first steering transistor and the one of the pair of complementary bitlines,
a second isolation transistor connected between the second steering transistor and the other of the pair of complementary bitlines, and
a precharge circuit that provides the first voltage supply to the first isolation transistor and the second isolation transistor, the first isolation transistor and the second isolation transistor being enabled when the bitline sense amplifier circuit is disabled.

11. The sense circuit of claim 9, further including an enabling transistor connected between the bitline sense amplifier circuit and a second voltage supply, the enabling transistor enabling the bitline sense amplifier circuit in response to a sense enable signal.

12. The sense circuit of claim 10, further including an enabling transistor connected between the bitline sense amplifier circuit and a second voltage supply, the enabling transistor enabling the bitline sense amplifier circuit in response to a sense enable signal.

13. A method for precharging a pair of complementary bitlines in a dynamic random access memory (DRAM), the method comprising:
a) precharging the pair of complementary bitlines to a first voltage supply level through first and second steering transistors during a precharge phase; and,
b) coupling one of the pair of complementary bitlines to a capacitor through the first or the second steering transistor during a sensing phase.

14. The method of claim 13, wherein the first and second steering transistors are serially connected between the pair of complementary bitlines.

15. The method of claim 13, wherein the precharging includes precharging the capacitor to a second voltage supply level during the precharge phase.

16. The method of claim 13, wherein the precharging includes passing the first voltage supply level to the pair of complementary bitlines through first and second isolation transistors.

17. The method of claim 16, wherein the coupling includes selectively enabling one of a first steering transistor and a second steering transistor to couple the capacitor to one of the first and second isolation transistors.

18. A dynamic random access memory comprising:
a bank having bitline sense amplifier circuits connected to pairs of complementary bitlines;
precharge switch circuits connected to the pairs of complementary bitlines that drive each of the pairs of complementary bitlines to a first voltage supply during a precharge phase, the precharge switch circuits adjusting one of the pairs of complementary bitlines to a reference voltage during a sensing phase;
a reference voltage circuit connected to each of the precharge switch circuits to provide the first supply voltage during the precharge phase and to provide a capacitance during the sensing phase; and
a capacitor connected to the reference voltage circuit to provide the capacitance.

19. The dynamic random access memory of claim 18, further including a second bank identically configured to the bank,
a second reference voltage circuit connected to second bank precharge circuits that provide the first supply voltage during the precharge phase and that provide the capacitance during the sensing phase, the capacitance being provided by the capacitor.

20. The dynamic random access memory of claim 18, wherein the reference voltage circuit includes
a precharge circuit that precharges the capacitor,
a selector switch selectively coupling one of the first voltage supply and the capacitor to an output node, the output node being connected to each of the precharge switch circuits.

21. The dynamic random access memory of claim 20, wherein the selector switch includes a first transistor and a second transistor connected in series between the first voltage supply and the capacitor, the output node being provided from a shared terminal of the first transistor and the second transistor.

22. The dynamic random access memory of claim 21, wherein the precharge circuit includes a third transistor connected between the capacitor and a second voltage supply.

* * * * *